United States Patent [19]
Anderson et al.

[11] Patent Number: 5,986,453
[45] Date of Patent: Nov. 16, 1999

[54] AC MAGNETIC SUSCEPTIBILITY CONTROL OF SUPERCONDUCTING MATERIALS IN NUCLEAR MAGNETIC RESONANCE (NMR) PROBES

[75] Inventors: Weston Anderson, Palo Alto; Richard S. Withers, Sunnyvale, both of Calif.

[73] Assignee: Varian, Inc., Palo Alto, Calif.

[21] Appl. No.: 08/965,842

[22] Filed: Nov. 7, 1997

[51] Int. Cl.[6] ........................................... G01V 3/00
[52] U.S. Cl. .................................. 324/300; 324/318
[58] Field of Search .................................. 324/300, 314, 324/315, 307, 309, 318, 321, 322

[56] References Cited

U.S. PATENT DOCUMENTS 5,508,613  4/1996  Kotsubo et al. ........................ 324/322
5,689,187  11/1997  Marek et al. ........................... 324/321

OTHER PUBLICATIONS

Wither, et al., entitled "HTS Receiver Coils for Magnetic–Resonance Instruments", published in *SPIE*, Apr. 1994, vol. 2156, pp. 27–35.

Orlando and Delin, Addison Wesley Publishing Co., entitled "Foundations of Applied Superconductivity", 1990, Chap's 6 and 7, pp. 259–391.

*Primary Examiner*—Louis Arana
*Attorney, Agent, or Firm*—Edward H. Berkowitz

[57] ABSTRACT

A method and apparatus which utilizes the hysteritic behavior of type II superconductors is provided for reducing the effective magnetic susceptibility of such high temperature superconducting materials being used close to the sample region in nuclear magnetic resonance system probes by providing decaying AC changes in the magnetic field parallel to said superconductive material. The method is particularly applicable to receiver coils. Reducing the effective magnetic susceptibility of superconducting receiver coils enables the improved sensitivity they inherently provide to be realized without loss of resolution resulting from line broadening caused by susceptibility discontinuities of materials near the sample region of the probe.

10 Claims, 13 Drawing Sheets

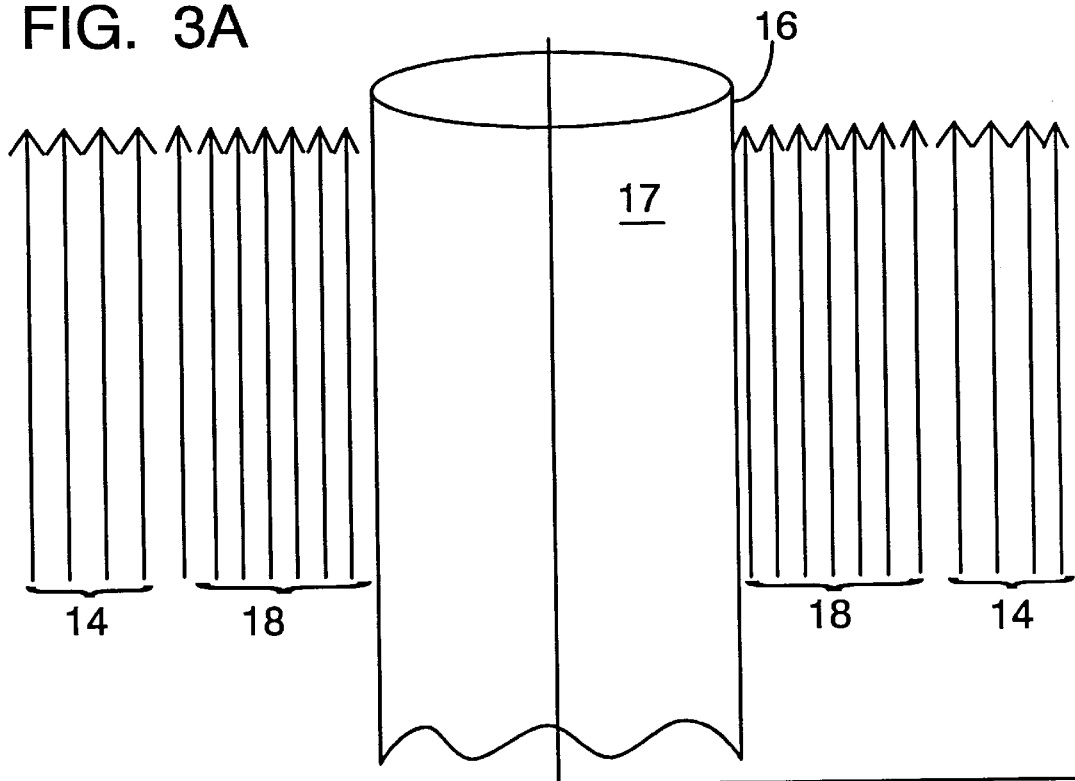
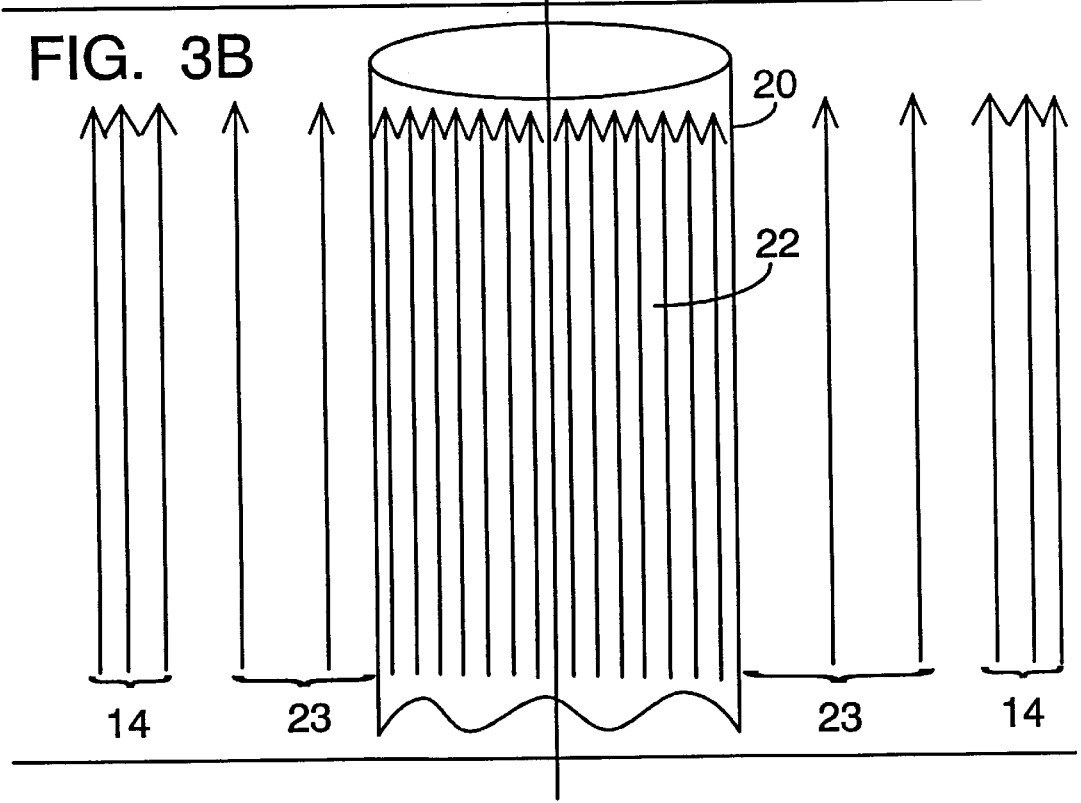

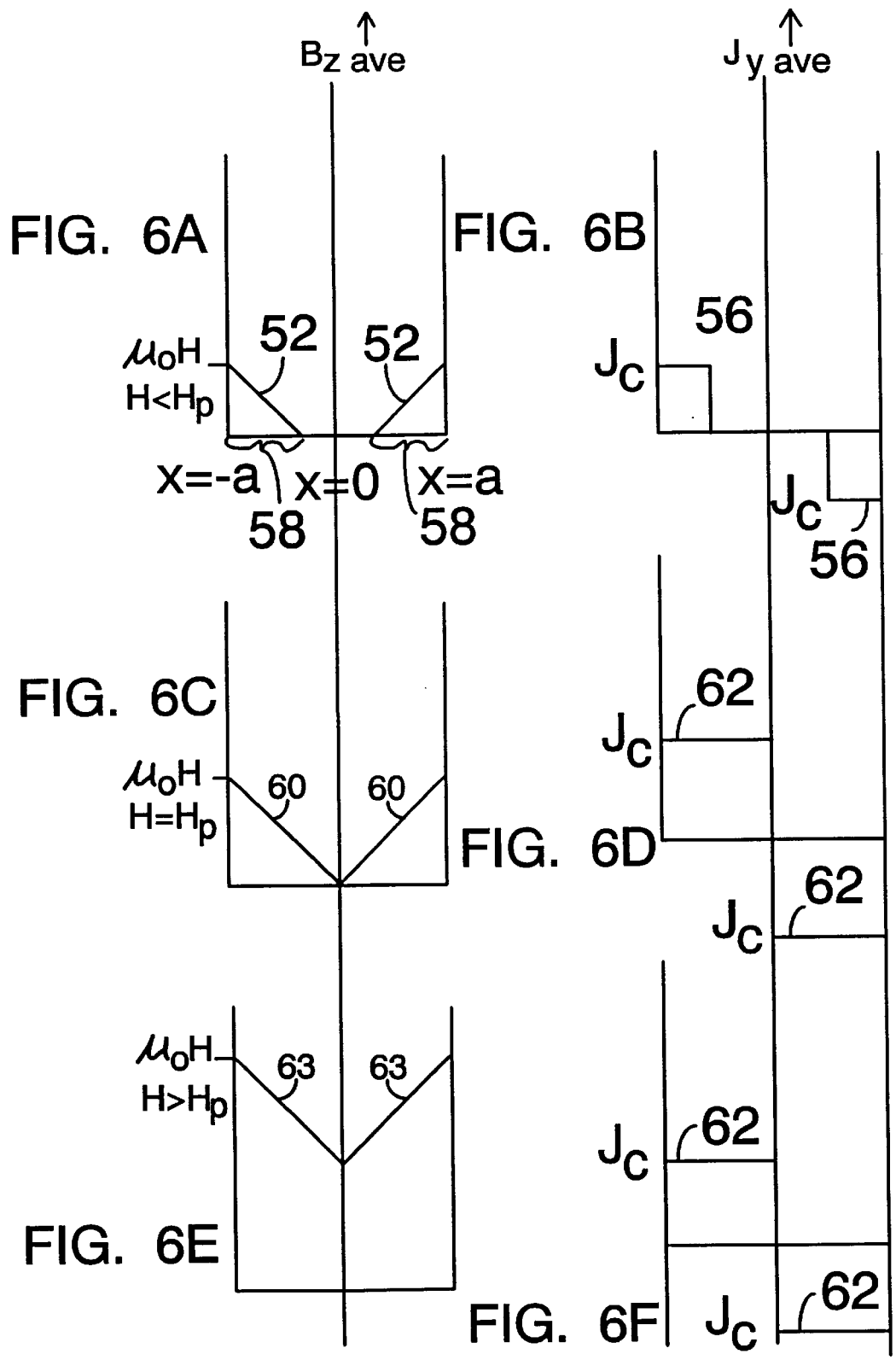

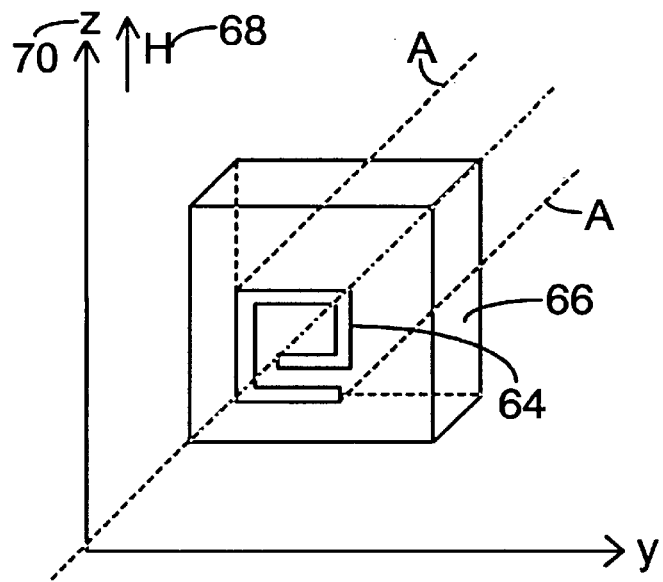
FIG. 7A
PRIOR ART
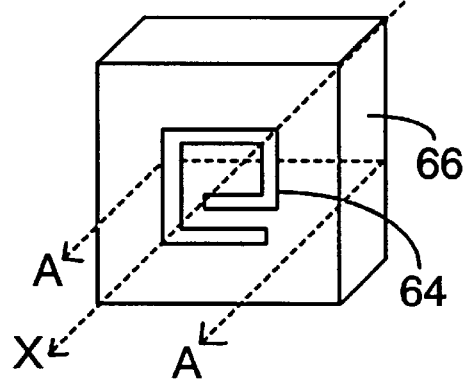
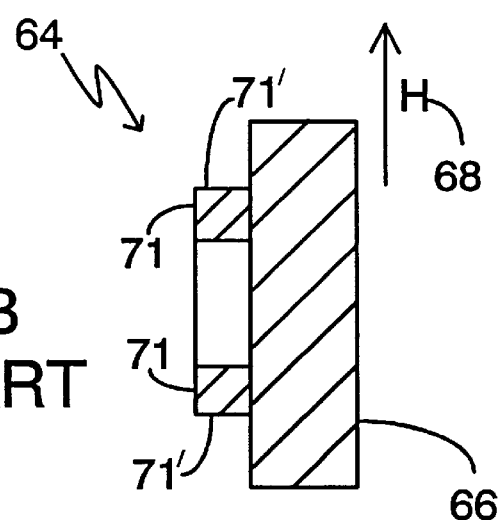
FIG. 7B
PRIOR ART
SECTION A-A

AC MAGNETIC SUSCEPTIBILITY CONTROL OF SUPERCONDUCTING MATERIALS IN NUCLEAR MAGNETIC RESONANCE (NMR) PROBES

FIELD OF TIE INVENTION

This invention relates to the field of nuclear magnetic resonance apparatus and in particular to probe structures incorporating high temperature superconductor (HTS) materials, and more particularly to methods and apparatus for minimizing perturbations of the polarizing and rf magnetic fields caused by HTS materials present in the region of the sample.

BACKGROUND OF THE INVENTION

Nuclear magnetic resonance (NMR) spectrometers first became available in 1946. In 1950 observations of "shifted" resonance in nitrogen spectra by W. G. Proctor & F. C. Yu, *Phys. Rev.* 77, 717,(1950) stimulated efforts to improve the homogeneity and stability of magnets used in the experiments and led to the observation of chemically shifted resonances in proton spectra by J. T. Arnold, S. S. Dharmatti, and M. E. Packard, *Jour. Chem. Phys.* 19, 1608,(1951). This marked the beginning of high resolution NMR and its application as an analytical tool for chemistry, and sparked rapid growth in the development of NMR spectrometers. This development continues today at a pace limited only by the availability of relevant technology. The present work is predicated upon improvements in rf probe performance incorporating receiver coils and other parts made from recently available high temperature superconducting (HTS) materials. HTS materials are type II superconductors. The terms "HTS materials" and "type II superconductors" will hereafter be used interchangeably herein.

Nuclei of most isotopes of the elements have non-zero spin and exhibit gyromagnetic properties. These non-zero spin nuclei behave like microscopic spinning bar magnets. When a static homogeneous magnetic field B is applied to an ensemble of spin active nuclei, the spins align, some in the direction of the field and some in the direction opposed to the field. A net polarization of the ensemble of spins in the direction of the field results and the spins are said to be "polarized" by the field. If a polarized ensemble of nuclei is simultaneously subjected to an rf magnetic field, usually called the $B_1$ field, said $B_1$ field having an appropriate frequency and spatial orientation with respect to the polarizing field B, an NMR response signal can be generated.

The broad general utility of NMR as a tool for determining the chemical structure of compounds is due to the influence of the molecular environment on the local magnetic field at the nuclei. The local magnetic field at the nucleus of a particular nuclear species at a particular site in a molecule is the vector addition of the externally applied field and the field caused by the magnetic influence of its molecular environment. By way of example, circulation of electrons about the nucleus caused by the applied field results in an induced field at the nucleus which in some instances opposes the applied field (diamagnetism), and in some instances augments it (paramagnetism). By way of further example the local field at a nucleus can be additionally modified, taking on multiple values or "splitting" due to interactions with other spin active nuclei in the molecule. These two effects, known as "chemical shift" and "spin-spin coupling" respectively, are major sources of the fine structure seen in NMR spectra as more fully described in "*Introduction To NMR Spectroscopy*", R. Abrahms, J. Fisher, P. Loftus, J. Wiley & Sons, 1993, chap. 2, pp. 13–33, chap. 3, pp. 34–59. NMR spectra which are characterized by resonance lines that are narrower than the shifts in resonance caused by chemical shift and spin-spin coupling are known as high resolution spectra. These lines are primarily made possible to observe by the application of an extremely homogeneous polarizing field. The frequency of the NMR response signal is proportional to the local magnetic field at the nuclei, the proportionality constant being γ, the magnetogyric ratio. Any slight deviation from homogeneity of the local magnetic field over the sample region causes a corresponding shift in the resonance of the nuclei affected resulting in undesirable line broadening of the response signal.

An NMR spectrometer is comprised of: 1) a DC magnet which provides the stable, homogeneous, static magnetic field required for polarizing the spins, 2) an rf system which provides a suitable rf excitation signal, 3) a coil or a plurality of coils for coupling the rf excitation to the spins and for receiving the NMR response signal, 4) a detection system for detecting the NMR response signal, 5) a signal processing system for processing the detected NMR response signal, and 6) an output device for displaying the NMR response signal. For high resolution NMR studies, the compound under investigation is usually dissolved in or mixed with a suitable solvent and is in liquid form contained in a sample tube which is typically 5 mm in diameter. The apparatus known as the probe holds the sample in a sample holder portion of a probe in the most homogeneous region in the magnetic field. The coil or coils for coupling the rf excitation to the sample and for detecting the NMR response signal are also mounted to the probe.

NMR is an inherently insensitive technique. Sensitivity is strictly defined in terms of the minimum concentration of a test material required to produce a signal that is just detectable above the level of noise. For practical purposes however, the signal to noise ratio, S/N, is generally considered a good measure of sensitivity. Continued improvement in sensitivity has been a constant objective in the development of NMR spectrometers. Increasing signal strength, reducing noise, and improving signal processing methods have all contributed to this improvement. Many of the factors that influence the attainable signal to noise ratio are treated in "*A Handbook of Nuclear Magnetic Resonance*", R. Freeman, Longman Scientific & Technical, 1988, pp. 216–229 which is hereby incorporated herein by reference.

In addition to sensitivity, resolution of spectral information is an important aspect of NMR spectrometer performance. Natural line widths can be narrow for liquid samples, less than 1 Hz by way of example. To avoid degrading the resolution, both the static magnetic field B and the rf excitation field $B_1$ should be homogeneous over the volume of the sample, and stable over the time of data acquisition to the order of 1 part in $10^9$. The data acquisition time can be very long, particularly when acquiring the spectra of nuclei other than protons, such as $^{13}C$ by way of example. For $^{13}C$ nuclei using natural abundance samples, the overall sensitivity relative to $^1H$ is $1.7 \times 10^{-4}$. The direct observation of $^{13}C$ nuclei therefore typically requires many scans and may require averaging the NMR responses over hours or days to achieve the required signal to noise ratio. Any small change in the magnetic field over this time period will cause the NMR signal to shift slightly and effectively broaden the resonance response. Field homogeneity requirements are addressed by careful magnet design, the use of shimming coils and by spinning the sample. Field-frequency lock systems, such as described in "*Modern NMR Spectroscopy*", J. K. M. Sanders & B. K Hunter, Oxford University Press, 1993, chap. 1, pp. 39–41. are used to achieve the required stability.

The probe is a critical component in an NMR spectrometer. For a given static magnetic field strength and a given sample size, the performance of the probe largely determines the sensitivity of the spectrometer. An important consideration in probe design is the coupling efficiency $\zeta$ of the receiver coil to the sample. $\zeta$ is the ratio of effective inductance to total inductance of the receiver coil. Any portion of the inductance of the receiver coil that does not contribute towards the detection of the NMR signal, such as the inductance of the leads of the receiver coil by way of example, results in a loss of sensitivity proportional to $\zeta^{1/2}$. Another important consideration is the quality factor Q of the receiver coil which affects sensitivity by a factor of $Q^{1/2}$, since signal voltage is proportional to Q and noise voltage is proportional to $Q^{1/2}$. Q represents the ratio of energy stored in the receiver coil resonant circuit to the energy dissipated through resistive losses in the circuit. Another important consideration in probe design is the receiver-coil filling factor $\zeta$ which, for a fixed coil volume, influences the signal strength and the sensitivity directly. $\zeta$ is a measure of the energy stored in the transverse magnetic field coupling to the sample, compared to the total magnetic energy stored in the receiver coil resonant circuit. Filling factor $\zeta$, coupling efficiency $\zeta$, and quality factor Q should all be as large as possible for maximum sensitivity.

Modem spectrometers use superconducting DC magnets for producing the static polarizing field. The sample is placed in a cylindrical tube positioned coaxial with the DC magnet. Transmitter and receiver coils made of normal, i.e. non-superconducting, materials can be saddle coils as shown in FIG. 1a or split formed-wire coils as shown in FIG. 1b. Either are ordinarily shaped to couple closely to the sample while providing the radio frequency $B_1$ field orthogonal to the static field. Coils made of high temperature superconducting (HTS) films are very attractive for use in NMR spectrometers because of their low rf resistance and resulting low noise. Using HTS materials, coils have been fabricated by depositing a thin layer of superconductor on a flat substrate. A pair of such coils forming a magnetically coupled system known as a Helmholtz pair, placed on opposite sides of a sample, is shown in FIG. 2a. A second pair of similar HTS coils can be positioned orthogonal to the first pair as shown in FIG. 2b to provide for a field-frequency lock signal.

Best results are obtained with HTS coils when the superconductor is lattice matched to the substrate, i.e. grown epitaxially. The substrate should be a thermally conductive material to facilitate cooling of the coil and should have low magnetic susceptibility to avoid degrading the homogeneity of the magnetic field. Acceptable substrate materials include sapphire, lanthanum aluminate, and magnesium oxide. A preferred HTS material is $YBa_2Cu_3O_{7-\delta}$ (YBCO), which has a critical transition temperature $T_C$ of approximately 87° K. A coil made of this material is described in "*HTS Receiver Coils For Magnetic Resonance Instruments*", R. S. Withers, B. F. Cole, M. E. Johansson, G. C. Laing, G. Zaharchuk, *Proc. SPIE*, 2156, 27–35, (1994). Another Class II superconductive material useful in this coil application is $Tl_2Ba_2CaCu_2O_8$.

For proper performance HTS coils must be maintained at a temperature significantly below their superconducting transition temperature $T_C$. U.S. Pat. No. 5,508,613 entitled *Apparatus For Cooling NMR Coils*, to Vincent Kotsubo and Robert D. Black, describes an apparatus for cooling HTS coils as required for proper operation. A particular embodiment incorporates a Joule-Thomson or Cillord-McMahon closed cycle refrigeration unit which cools the coils to 25° K. The coils are generally thermally isolated from the samples in this apparatus and the samples can be maintained at or near room temperature if desired.

High resolution NMR probes using HTS coils can provide higher sensitivity than probes with non-superconducting coils. For a given sample volume the sensitivity of a coil is proportional to $(\xi Q/T)^{1/2}$, where T is the coil temperature and $\xi$ and Q are the aforementioned filling factor and quality factor respectively. A superconducting coil may have a Q of 20,000 as compared with a Q of 250 for a room temperature coil and is typically operated at 25° K as compared with 300° K for a room temperature coil. With the geometry appropriate for a 5 mm. sample tube, and allowing for the loss of filling factor required for thermal isolation of the sample from the coil, the potential sensitivity gain can approach a factor of 10.

It is known in the art that the probe materials and sample materials can cause significant distortion of the polarizing and rf magnetic fields due to their susceptibility. To achieve high resolution spectra, these distortions must be controlled and/or corrected. In particular, abrupt changes in susceptibility near the sensitive sample region of the probe can cause serious degradation of the field uniformity at the sample region, which can generally be partially corrected with shim coils. The aforementioned field distortion can be minimized by using cylindrical symmetric components and positioning material boundaries as far removed as possible from the sample region. Additionally, careful choice of the materials used in the probe is of paramount importance. Materials normally used in NMR probes have diamagnetic volume susceptibilities of several parts per million.

All weakly magnetic materials can be categorized as either diamagnetic or paramagnetic. When placed in a magnetic field, a diamagnetic material tends to minimize its internal flux density within whereas a paramagnetic material tends to increase its internal flux density within itself. In either case, the presence of a magnetic material in an externally applied magnetic field will modify the field distribution in the space proximate to it as illustrated in FIGS. 3a for diamagnetic material and 3b for paramagnetic material.

The best known characteristic of superconductors is their ability to carry a steady current without any power loss., i.e., without any associated voltage drop. Complete magnetic flux expulsion, commonly known as the Meissner effect, is a second fundamental characteristic of superconductivity. The class of superconducting materials which completely expel flux from their bulk volume, thereby maintaining a condition of zero flux density internally, are known as type I superconductors. A type I superconductor is perfectly diamagnetic. Type I superconductors are characterized by a low critical transition temperature $T_C$ and a single critical magnetic field $H_C(T)$ with a relatively small range.

A large class of materials known as type II superconductors allow flux to enter the bulk of their volume in a special way and in small quantized amounts, as described in "*Foundations of Applied Superconductivity*", Orlando and Delin, Addison Wesley Publishing Co., 1990, chap's 6, 7, pp. 259–391, which is hereby incorporated by reference. Type II superconductors typically have a higher critical transition temperature TC than Type I superconductors and they have two critical fields, $H_{C1}(T)$ and $H_{C2}(T)$. For values of $H<H_{C1}$, type II superconductors behave like type I superconductors and exhibit the aforementioned Meissner effect. For values of H such that $H_{C1} \leq H \leq H_{C2}$, the type II superconductor is in a mixed or vortex state in which a finite amount of flux penetrates the interior volume of the material. Since $H_{C1} \ll H_{C2}$, the magnetic field range for the mixed state tends to be large over most of the superconducting temperature range. Type II superconductors therefore are practical for, and useful in, engineering applications such as NMR probe coils.

The dipole field required to account for flux expulsion can be modeled in terms of induced magnetization as illustrated in FIG. 4a to FIG. 4c. The resulting field as shown in FIG. 4c can be envisioned as the superposition of the applied magnetic field, FIG. 4a and the field created by the induced magnetization, FIG. 4b, the latter representing the intrinsic magnetic property of the material. Within the superconductor the magnetic flux density is given by $B=\mu_0(H+M)$ where $\mu_0$ is the permeability of free space, H is the applied field and M is the induced magnetization. Ignoring saturation effects, the relationship between the induced magnetization M and the applied field H is linear for type I superconductors. The magnetic susceptibility $\chi_m$ of the material is defined by the relationship $M=\chi_m H$. For a type I superconductor $\chi_m=-1$ and $M=-H$.

The relationship between induced magnetization M and applied field H is much more complicated for a type II superconductor than for a type I superconductor. As heretofore mentioned, flux vortices penetrate into the bulk volume of the superconductor at applied fields $H \geq H_{C1}$. The type II superconducting material is constituted to provide pinning forces for the purpose of inhibiting lateral movement of the vortices when an externally driven current is passed through the material. Such vortex movement would cause undesired power losses. Because of the pinning forces however, the flux vortices, after penetrating the surface when the applied field exceeds $H_{C1}$, are not uniformly distributed throughout the bulk of the superconductor in an equilibrium lattice, but instead are bunched up near the surface. As the applied field is further increased above $H_{C1}$ the flux vortices are forced further into the superconductor but they remain non uniformly distributed throughout the bulk volume.

Because the magnetic flux and magnetization are non-uniformly distributed in the type II superconductor, the characteristics of the bulk material are best described in terms of average values of the fields over the volume. These are sometimes called the "thermodynamic fields" and will hereafter be so referred to herein. The thermodynamic magnetic field, thermodynamic magnetic flux density and thermodynamic magnetization will hereafter be designated as $\mathcal{H}$, $\mathcal{B}$, and $\mathcal{M}$ respectively. They obey the relationships $\mathcal{B}=\mu_0(H+M)$ The so-called critical state model, which applies to type II superconductors with strong pinning, is described in the aforementioned and incorporated reference "*Foundations of Applied Superconductivity*", Orlando and Delin, Addison Wesley Publishing Co., 1990, pp. 374–380. In accordance with the critical state model, the dependence on the thermodynamic magnetic field $\mathcal{H}$ of the thermodynamic flux density $\mathcal{B}$ and the thermodynamic magnetization $\mathcal{M}$ are shown in FIGS. 5a and 5b respectively as the thermodynamic field $\mathcal{H}$ is first increased from zero to $H_{max}$ and then decreased from $H_{max}$ back to zero. It is of particular significance for purposes of the present work that the thermodynamic flux density $\mathcal{B}$ thermodynamic magnetization $\mathcal{M}$ of the type II superconductor as functions of the thermodynamic fields $\mathcal{H}$ are history dependent., i.e., that they are hysteritic.

According to the critical state model, as an external magnetic field is applied to the superconducting material, surface currents are set up that flow in such a direction as to exclude magnetic flux from the interior of the material. However there is a limiting current density $J_C(H)$ that the superconductor can carry. The model assumes that there are only three states of current flow possible with a given magnetic field axis, one being zero current density for regions that have never felt the magnetic field. The other two are full current flow $J_C(H)$ perpendicular to the axis, but each are of opposite sense from the other depending on the sense of the electromotive force that accompanied the last local change of applied field. These local currents contribute to the magnetization of the material and thereby influence its effective susceptibility. FIGS. 6a, 6c and 6e show the locally averaged magnetic flux density distributions in a thin film superconductor of thickness 2a for different values of an increasing applied magnetic field H. The field is oriented parallel to the surface of the superconductor. FIGS. 6b, 6d and 6f show the corresponding current density profiles. The applied field H at which the flux fully penetrates the film is known as the penetration field, which will hereafter be designated $H_P$ herein. It can be shown for the aforementioned thin film of thickness 2a, that $H_P=J_C(H)(a)$ and that the thermodynamic magnetization $\mathcal{M}$ is $-H_P/2$. At field values of $H_P$ and above the effective susceptibility $\chi_m \equiv \mathcal{M}/H$ is equal to $-0.5\ J_C(H)\ a/H$.

To maintain homogeneity of the magnetic fields in the sample region of an NMR spectrometer, the most critical probe component which must be considered is the coil, because it is generally closest to the sample region and inevitably includes some susceptibility discontinuities in its geometry. For normal coil materials, i.e. non-superconducting, coils field perturbations can be minimized by constructing the coils of materials such that the overall coil structure exhibits a low average value of magnetic susceptibility. This is accomplished by making the coils from a composite material with diamagnetic and paramagnetic components using methods such as electroplating by way of example, to produce a sandwich structure of the two types of materials. Overall high electrical conductivity is maintained for this structure. Suitable diamagnetic materials include copper, silver and gold. Suitable paramagnetic materials include aluminum, rhodium and platinum.

However, when employing HTS materials as probe coils to realize the aforementioned higher sensitivity, the use of sandwich structures of the two types of susceptibility materials as described in connection with normal materials above is not an available option. Therefore the improved sensitivity under these circumstances has generally been achievable only at the cost of degraded resolution. The tradeoff of degraded spectral resolution for improved sensitivity has heretofore limited realization of the full potential inherent in the use of HTS materials in NMR probes.

SUMMARY OF THE INVENTION

We have provided a method and apparatus for reducing the effective magnetic susceptibility of HTS materials used in NMR probes to a near zero value. This significantly reduces distortions of the homogeneous polarizing and rf magnetic fields, said distortions being caused by discontinuities in susceptibility at material boundaries in the probe. Broadening of spectral lines and consequent degradation of spectral resolution resulting from distortion of the magnetic fields can thereby be minimized or even eliminated. The improved sensitivity inherently achievable using a HTS receiver coil can be fully realized using this invention without accompanying degradation of spectral resolution resulting from magnetic field distortion.

An object of this invention is to provide a high sensitivity, high resolution NMR probe.

Another object of this invention is to control the magnetic susceptibility of type II superconducting materials used in NMR probes.

Another object of this invention is to minimize distortions of the magnetic fields caused by type II superconducting materials used in NMR probes.

Another object of this invention is to minimize distortions of the magnetic fields in the sample region of NMR probes.

Another object of this invention is to provide a method for demagnetizing type II superconducting materials used in NMR probes.

Another object of this invention is to provide a method for optimally demagnetizing rf probe coils in NMR probes.

BRIEF DESCRIPTION OF THE DRAWINGS

FIG. 2c is a sectional view of the pair of HTS coils of FIG. 2a.

FIG. 3a illustrates the affect of a diamagnetic material on a magnetic field.

FIG. 3b illustrates the affect of a paramagnetic material on a magnetic field.

FIG. 6a shows, for $H<H_p$, a locally averaged magnetic flux density distribution in a thin film.

FIG. 6b shows, for $H<H_p$, a locally averaged current density profile in a thin film.

FIG. 6c shows, for $H=H_p$, a locally averaged magnetic flux density distribution in a thin film.

FIG. 6d shows, for $H=H_P$, a locally averaged current density profile in a thin film.

FIG. 6e shows, for $H>H_P$, a locally averaged magnetic flux density distribution in a thin film.

FIG. 6f shows, for $H>H_P$, a locally averaged current density profile in a thin film.

FIG. 7a is a more detailed schematic of the FIG. 2a pair of prior art HTS receiver coils.

FIG. 7b is a cross section through the HTS receiver coil of FIG. 7a.

DETAILED DESCRIPTION OF THE INVENTION

Figure 1A:
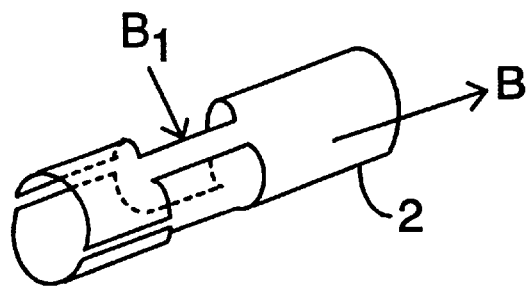
FIG. 1a illustrates the structure of prior art saddle type probe coil.
Figure 2A:
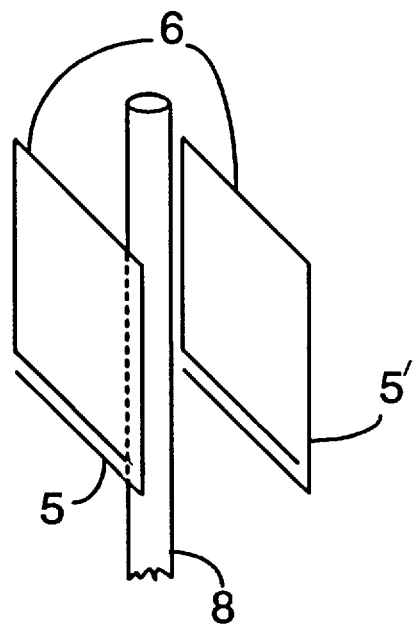
FIG. 2a is a schematic drawing of a pair of HTS coils.
Figure 2B:
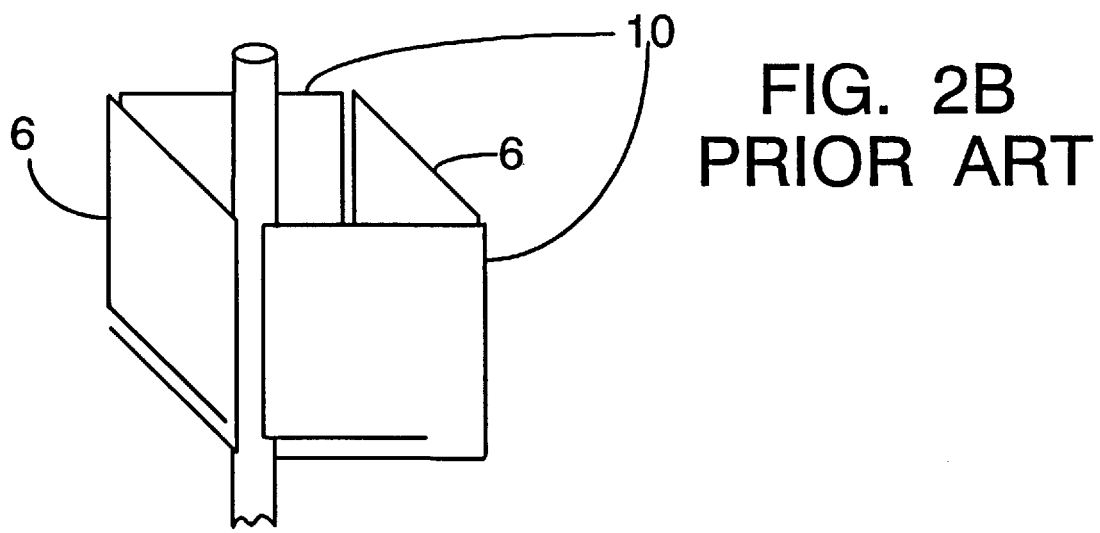
FIG. 2b is a schematic drawing of an orthogonal pair of HTS coils.

FIG. 1a shows a prior-art saddle type probe coil 2 and FIG. 2b shows a prior-art split, formed- wire probe coil 4. Both are cylindrically shaped to maximize the filling factor for a cylindrical sample and both are preferably fabricated from composite normal materials as heretofore described to minimize their average magnetic susceptibility.

Figure 2C:
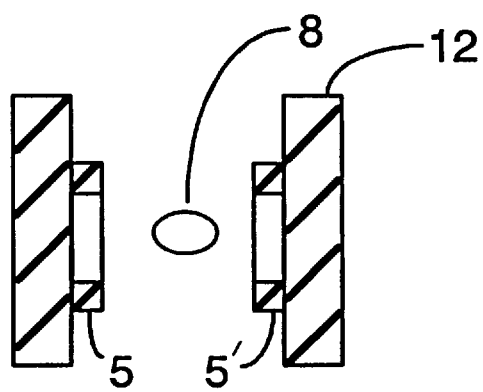

With reference to FIG. 2a, a pair of prior-art planar thin film so called high temperature superconductors (HTS) probe coils 5, 5' forming a Helmholtz coil pair 6 is shown schematically disposed on opposite sides of a cylindrical sample 8. The substrate on which the coils 5, 5' are deposited are assumed but not shown. In FIG. 2b, a second prior-art Helmholtz coil pair 10 is shown disposed orthogonal to the coil pair 6. Substrates for coil pair 10 are also assumed but not shown. In FIG. 2c, a sectional view through the coil pair 6 and the cylindrical sample 8 of FIG. 2a is shown, including the substrate 12 on which coils 5, 5' are deposited. Such HTS coils significantly disturb the homogeneity of the magnetic field in the sample region of the probe.

With reference to FIGS. 3a, 3b, 3c, and 4, straight segments of conductors representative of portions of coils, are used to simplify illustration of the effects of said coils on uniform magnetic fields in which they are immersed. The conductors shown in the figures are arbitrarily shown as circular in cross section. The effects illustrated apply as well to conductors with other cross sections such as rectangular thin films with high aspect ratios by way of example.

Figure 1B:
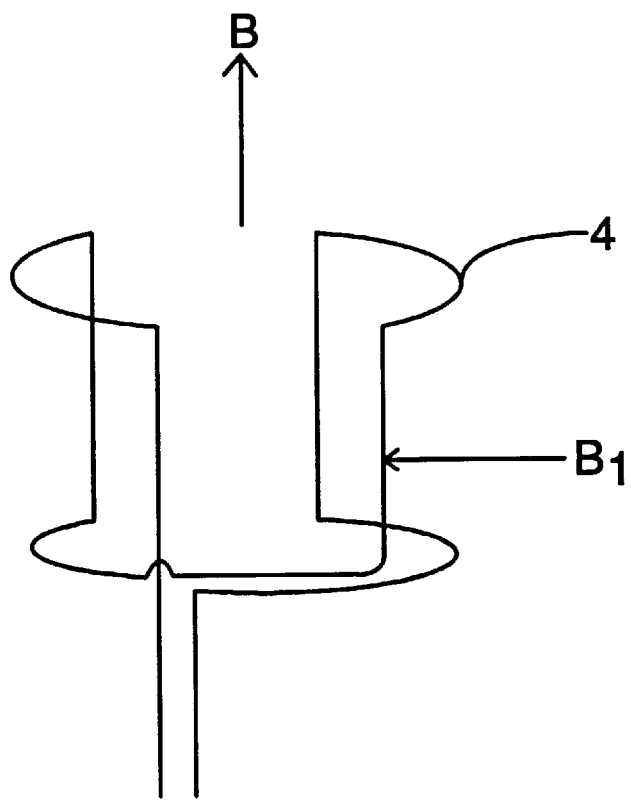
FIG. 1b shows a prior art split formed wire probe coil.
Figure 3C:
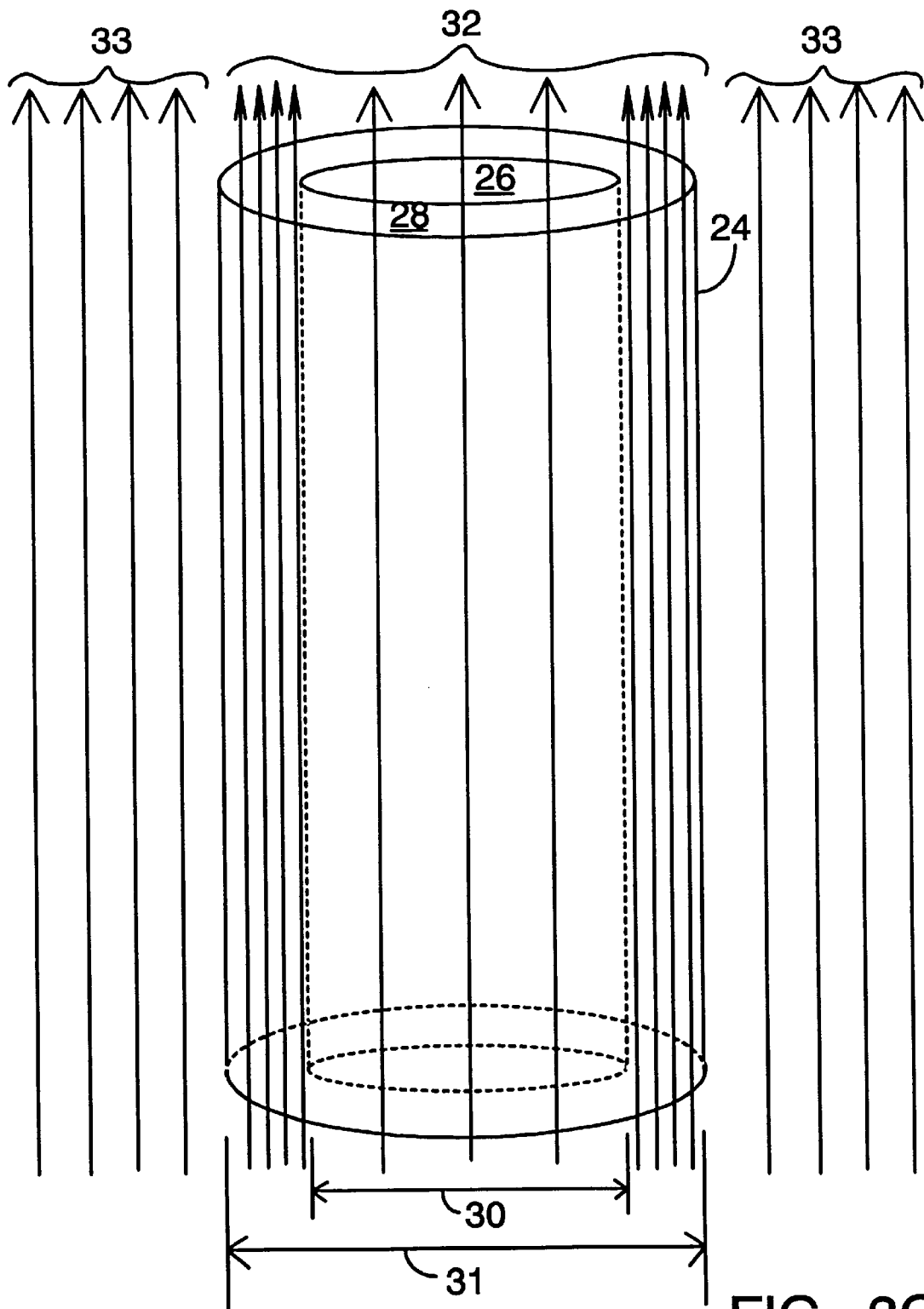
FIG. 3c illustrates the affect of a composite conductor on a magnetic field.

FIG. 3a shows homogeneity distortion of an otherwise uniform applied magnetic field 14 caused by a long, perfectly diamagnetic conductor 16 placed in the field. The magnetic flux B is equal to zero within the conductor 17 by virtue of the Meissner effect. The external field strength in the region immediately proximate to the conductor 18 is increased. FIG. 3b illustrates the field distortion caused by a paramagnetic conductor 20 placed in the uniform field 14. The magnetic flux density 22 within the conductor 20 is greater than that of the original field 14 in the region of the paramagnetic conductor and the external field strength 23 in region 18' is therefore decreased proximate to the conductor. FIG. 3c illustrates a prior art composite conductor 24 comprised of a solid core diamagnetic portion 26 and a solid annular paramagnetic layer portion 28, their respective dimensions 30,31 being chosen such that the average magnetic flux density within the conductor equals the flux density in the region occupied by the conductor prior to its introduction into the field. As is illustrated schematically, by satisfying this condition minimizes distortion of the applied field in the region 33 proximate to the conductor. As heretofore described, prior-art probe coils such as those shown in FIGS. 1a and 1b are preferably fabricated using composite materials meeting these conditions.

Figure 4C:
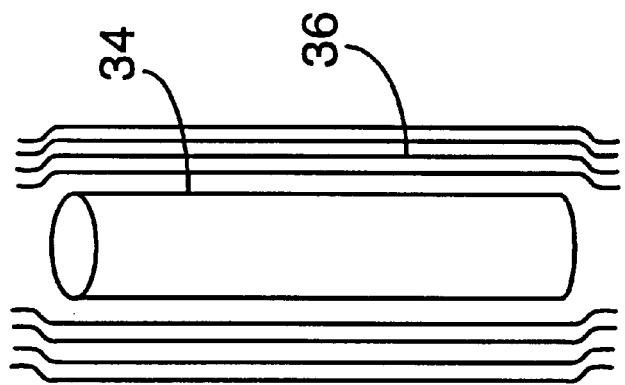
FIG. 4c shows the resultant absence of magnetic field within a perfect diamagnetic material
Figure 4B:
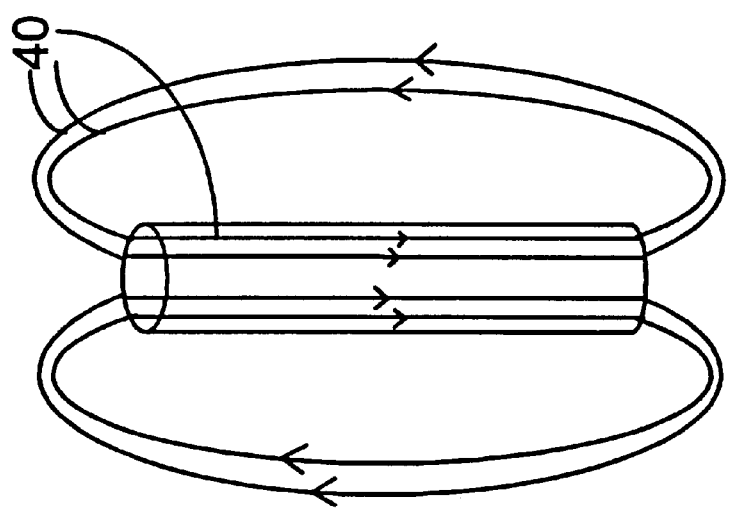
FIG. 4b shows bucking field pervading diamagnetic material due to induced magnetization.
Figure 4A:
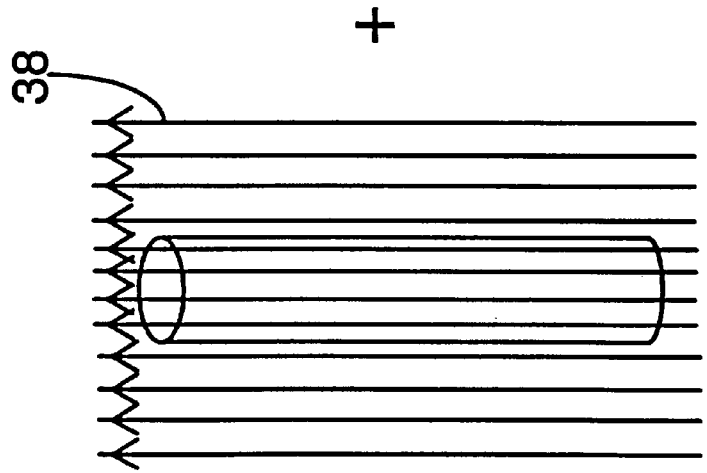
FIG. 4a shows a diamagnetic material pervaded by a magnetic field.

With reference to FIG. 4a to FIG. 4c, the Meissner effect magnetic field distribution within a perfectly uniform diamagnetic conductor 34 and the region proximate to it 36 are represented as the superposition of 1) the uniform applied magnetic field 38 in the absence of the conductor and 2) the field due to the induced magnetization M 40 which represents the inherent magnetic property of the material. A corresponding representation can be made for a uniformly magnetized paramagnetic material. Inside the conductor, the magnetic flux density $B=\mu_O(H+M)$ where $\mu_O$ is the permeability of free space, H is the applied magnetic field and M is the induced magnetization. The relationship $M=\chi_m H$ defines the magnetic susceptibility $\chi_m$ which is negative for diamagnetic materials and positive for paramagnetic materials. As discussed, within a type I superconductor, which is a perfectly diamagnetic medium, B=0. Therefore M=−H and the magnetic susceptibility $\chi_m$=−1. Because type I superconductors have critical transition temperatures which are very low, i.e. 4 degrees Kelvin, and limited magnetic field range, they have not been generally useful in NMR probe engineering applications.

Figure 5A:
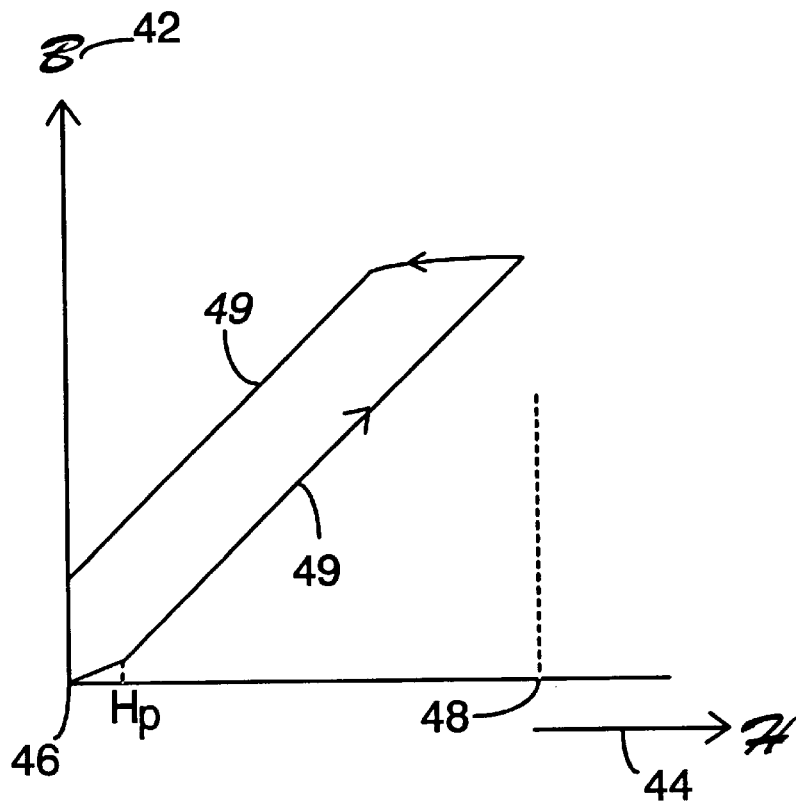
FIG. 5a is a plot of thermodynamic flux density vs. magnetic field.
Figure 5B:
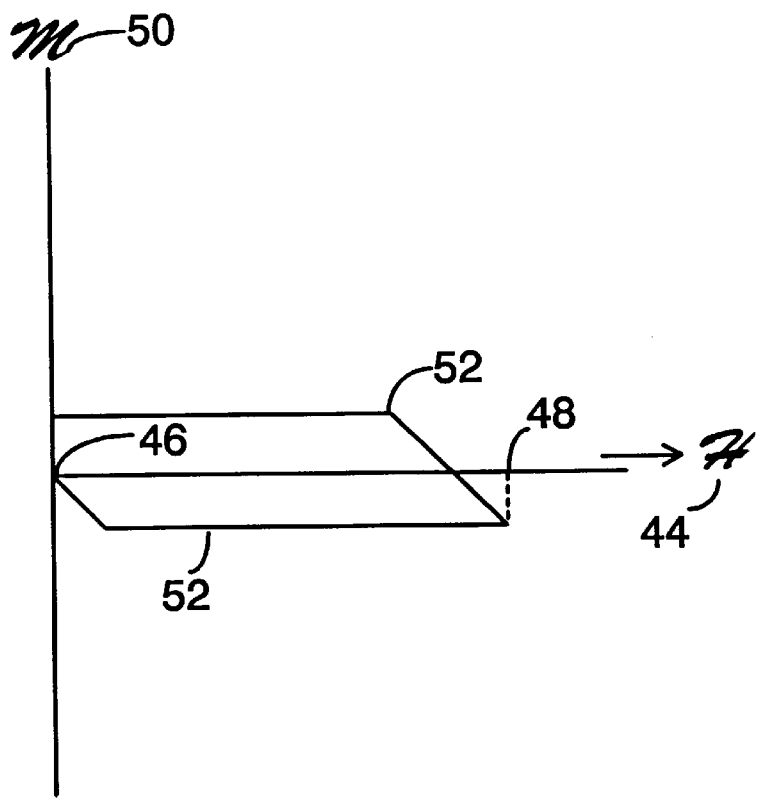
FIG. 5b is a plot of thermodynamic magnetization vs. magnetic field.

To understand the instant invention, one must understand the relationship between the thermodynamic flux density $\mathcal{B}$ 42 and the thermodynamic magnetic field $\mathcal{H}$ 44 for a type II superconductor. With reference to FIG. 5a, it can be seen that as $\mathcal{H}$ 44 is first increased from a value of zero 46 to a maximum value $H_{max}$ 48 and then decreased from $H_{max}$ 48 back to zero 46 that $\mathcal{B}$ 42 does not return to zero. The curve is traversed in the direction of the arrows 49. FIG. 5b shows the relationship between the thermodynamic magnetization $\mathcal{M}$ 50 and the thermodynamic magnetic field $\mathcal{H}$ 44 for a type II superconductor as $\mathcal{H}$ 44 is first increased from a value of zero 46 to a maximum value $H_{max}$ 48 and then decreased from $H_{max}$ 48 back to a value of zero 46. The curve is traversed in the direction of the arrows 52. As can be seen, both $\mathcal{B}$ and $\mathcal{M}$ are hysteritic functions of $\mathcal{H}$.

For the case where the applied magnetic field is parallel to the surface of a type II superconductor, FIGS. 6a through 6f are prior known illustrations showing magnetic flux density distributions and the corresponding current density profiles within such a thin film Class II superconductor.

With reference to FIG. 6a, the locally averaged flux density distribution 52 within the thin film having a thickness 2a, as a function of position in the film, is shown for the applied field 54 H<$H_P$ where $H_P$ is the aforementioned penetration field. FIG. 6b shows the corresponding current density $J_C$ profile 56 .and shows that the current flow is limited to the depth of penetration 58 of the field. FIG. 6c shows the flux density distribution 60 for H=$H_P$ at which there is full penetration of the field into the superconductor. FIG. 6d shows the corresponding uniform current density $J_C$ 62 throughout the bulk volume of the superconductor. FIG. 6e shows the flux density distribution 63 for H>$H_P$. The current density 62 as shown in FIG. 6f remains uniform throughout the superconductor at its maximum value $J_C$.

With reference to FIG. 7a, a pair of prior art HTS thin film receiver coils 64 are shown deposited on substrates 66. The applied polarizing field H 68 of the spectrometer is oriented in the direction of the z axis 70. FIG. 7b is a sectional view of one receiver coil 64 deposited on substrate 66. The applied field 68 is parallel to the surface 71 of the thin film receiver coil 64 and perpendicular to the side wall 71'.

Figure 8:
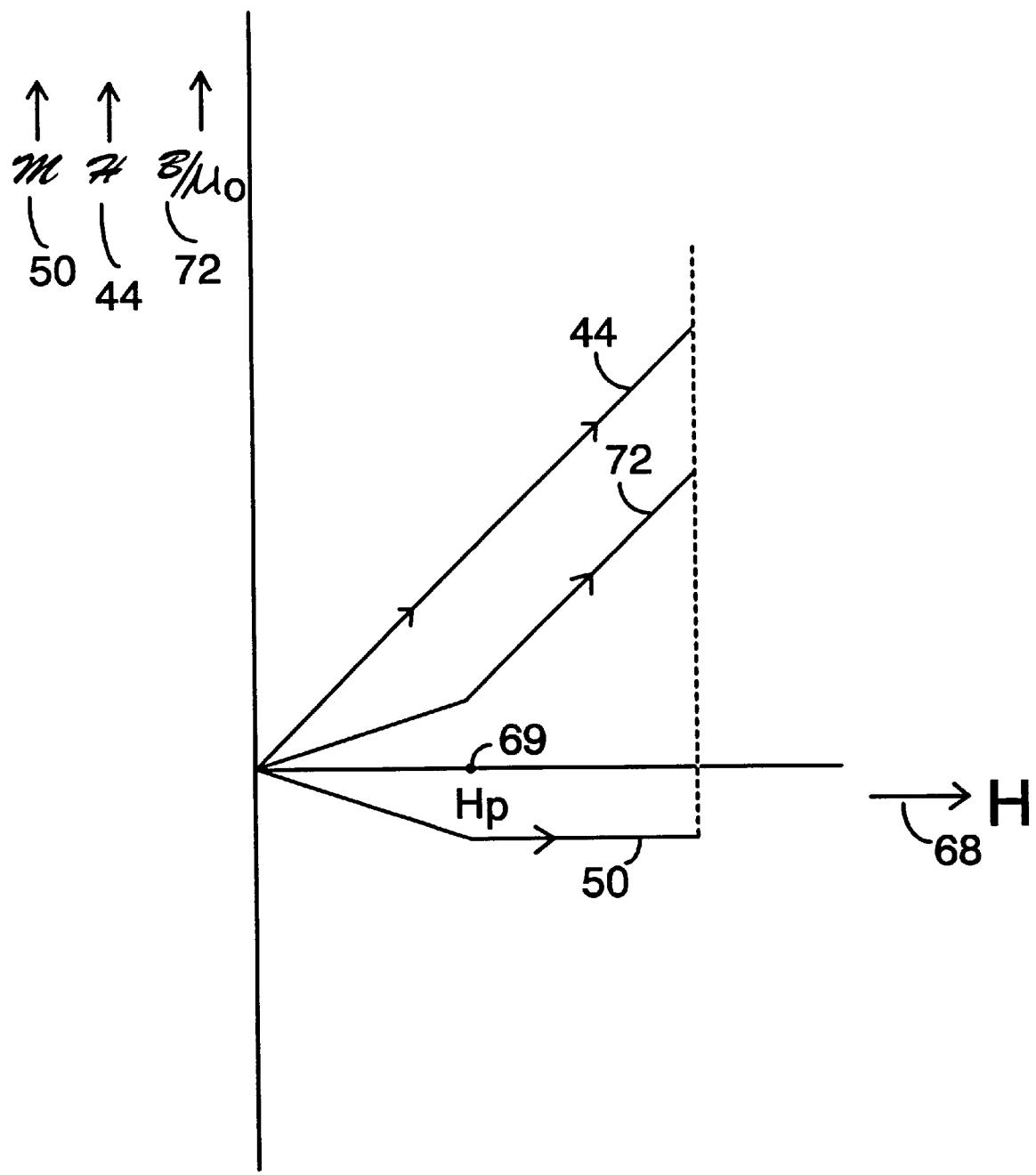
FIG. 8 is a plot of thermodynamic fields as a function of the applied magnetic field.

With reference to FIG. 8, for the aforementioned case of FIG. 7b, i.e. applied field 68 parallel to surface 71 of coil 64, the thermodynamic fields $\mathcal{H}$ 44, $\mathcal{B}/\mu_0$ 72, and $\mathcal{M}$ 50 are shown as functions of the applied field H 68 as H is increased from zero. The thermodynamic magnetization $\mathcal{M}$ remains constant as the applied field H 68 is increased above the penetration field Hp 69 because the current distribution for the locally averaged current density J remains the same.

Figure 9A:
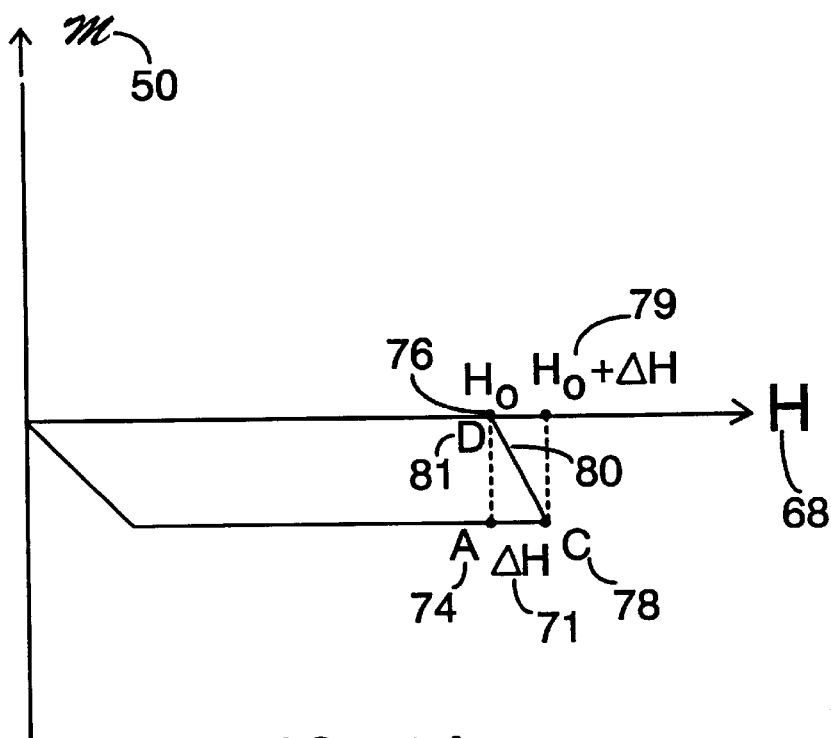
FIG. 9a shows a single pulse demagnetizing procedure.

The inventive method for demagnetizing and reducing the effective susceptibility is described in connection with FIGS. 9a through 12. With reference to FIG. 9a, a first embodiment of the inventive method is shown for bringing the magnetization $\mathcal{M}$ 50 of the HTS thin film receiver coil to zero or near zero. Point A, 74 is the state of magnetization of the film after being placed in the axial field $H_0$ 76 of the polarizing magnet. The magnetic flux density B corresponding $H_0$ 76 is typically between 4.7 Tesla and 23 Tesla for spectrometer applications of interest. At point A, 74 the film exhibits magnetization which may cause broadening of spectral lines and be detrimental to the spectrometer resolution. If the axial magnetic field H 68 can be increased by ΔH, 71 to $H_0$+ΔH 79, the magnetization could advance to point C, 78. One way this can be accomplished is by applying a brief pulse of current to a demagnetizing coil 1 surrounding the NMR probe as shown in FIG. 13. When the current in the pulse is reduced to zero bringing H back to its original value $H_0$ 76, the magnetizations $\mathcal{M}$ the film moves along the hysteresis path 80 towards zero at point D, 81. It can be shown that the value of ΔH required to bring the magnetization 50 to zero is approximately equal to the product of the HTS film's critical current density $J_C$ and its thickness 2a. i.e. $\Delta H=(2-\sqrt{2})a\, J_C$.

Figure 9B:
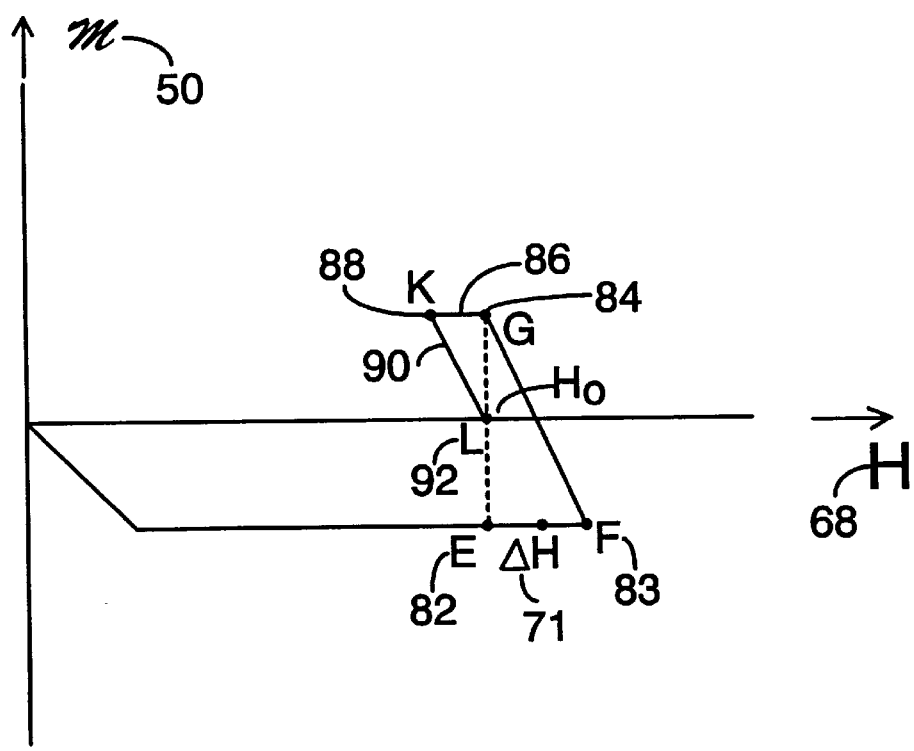
FIG. 9b shows a single pulse demagnetizing procedure with an excessively large current pulse applied.

As shown in FIG. 9b, the sign of the magnetization $\mathcal{M}$ 50 can be reversed if an excessively large current pulse is applied and then removed from the demagnetizing coil. The magnetization 50 will follow the path from point E, 82 to point F, 83 and then to point G, 84. This magnetization would also be disturbing to the homogeneity. However, by then applying a demagnetizing current in the reverse direction in the demagnetization coil 1, the magnetization can be brought back to zero via the path 86 from point G, 84 to point K, 88. When the pulse stops, the magnetization will trace the path 90 from point K, 88 to point L, 92. At point L, 92 the field is back to its initial value $H_0$ and the magnetization $\mathcal{M}$ and the effective susceptibility $\chi_{eff}=\mathcal{M}/H$ are zero or near zero.

Figure 10:
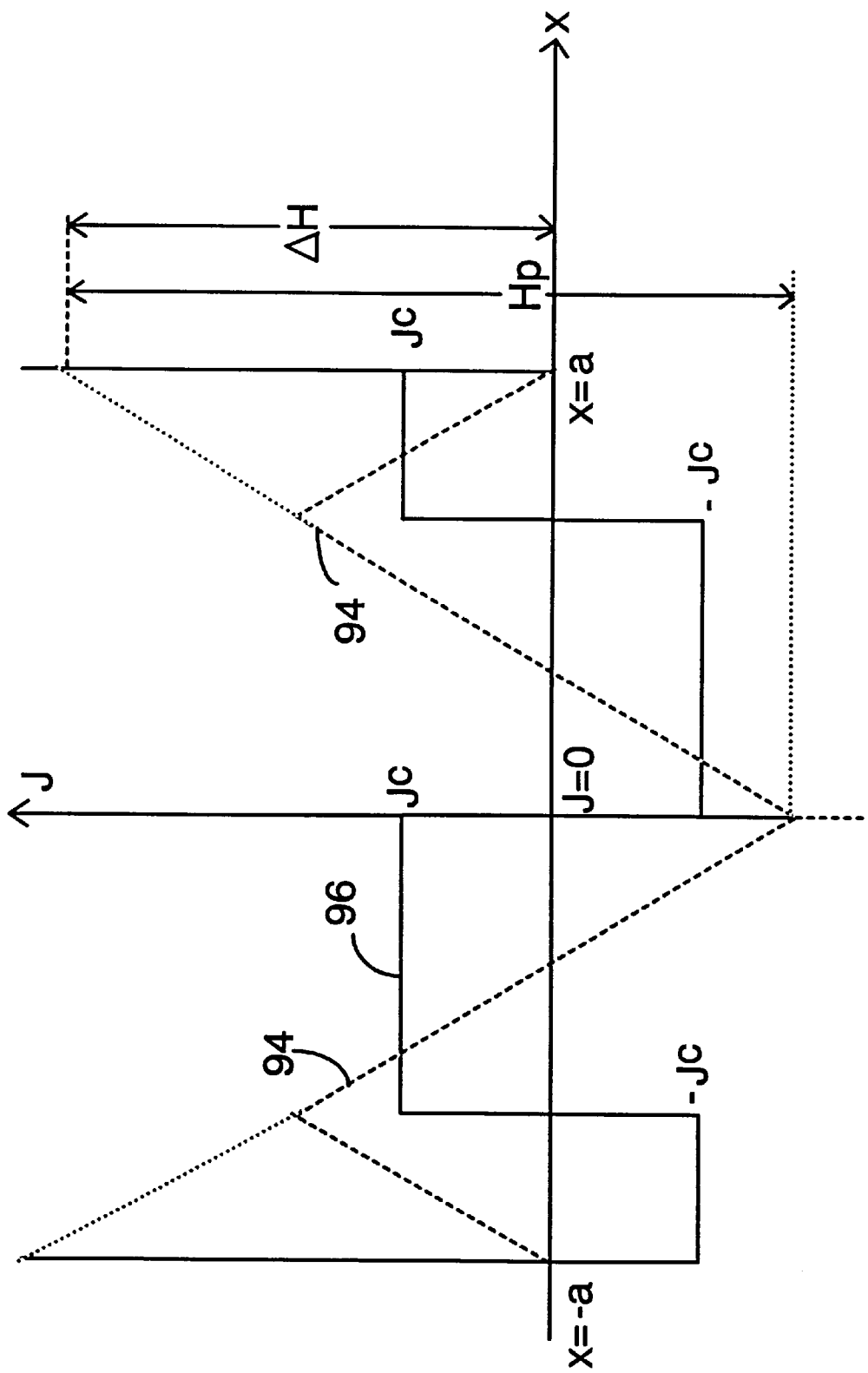
FIG. 10 shows plots of the magnetization and current density in a superconducting film after a single pulse demagnetization.

With reference to FIG. 10, profiles of the magnetization M 94 and the current density J 96 in the superconducting thin film as a function of position are shown. This is the profile after the field has been brought back to its initial value $H_0$ as shown in the process of FIG. 9a. After the pulse stops, as the magnetic field is decreasing back towards the initial value $H_0$, the induced currents 98,100 in the outer regions of the superconducting material reverse their directions and the thermodynamic magnetization $\mathcal{M}$ and the effective susceptibility $\chi_{eff}=\mathcal{M}/H$ are reduced to zero or near zero when the area from x=a to x=−a inder curve 94 sums to zero.

In the embodiment of the invention described in FIGS. 9a and 10 only a single brief application of current is applied to the demagnetizing coil to achieve reduced magnetization. However in this single pulse embodiment, accurate knowledge of the values of $J_C$ ($H_0$) and the film thickness 2a are required. FIG. 9b illustrates an extension of the invention described in FIGS. 9a and 10. The reversed brief pulse of current to the demagnetizing coil, which causes the change in magnetization from point G, 84 to point K, 88 in FIG. 9b corrects for an excessively large initial pulse. By providing several alternately positive and negative brief pulses of current to the demagnetizing coil a more complete demagnetization of the probe coils is achievable.

An alternative embodiment described in connection with FIGS. 11 and 12 achieves the demagnetizing process while also being relatively immune to variations in these quantities ($J_c$ and $2a$) and makes a prior accurate knowledge of them unnecessary.

Figure 11:
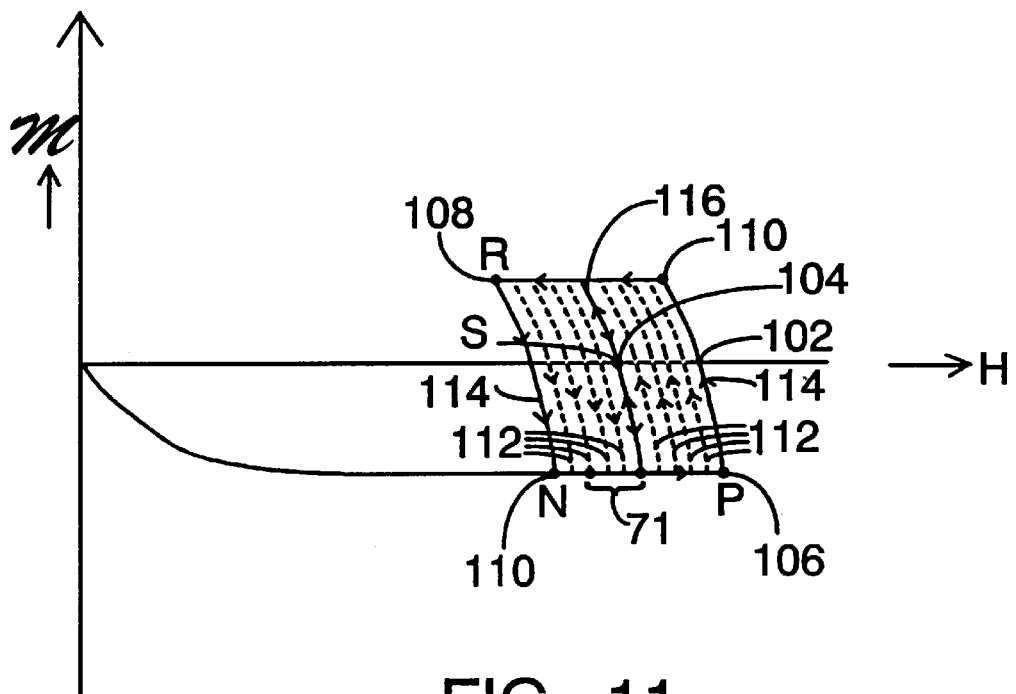
FIG. 11 shows an AC demagnetization procedure.

With reference to FIG. 11 the thermodynamic magnetization $\mathcal{M}$ is shown as a function of the applied field H for the process employing AC demagnetization instead of one or two demagnetizing pulses of magnitude ΔH 71. An AC waveform of magnitude ≧ΔH is applied and allowed to slowly decay. The hysteritic $\mathcal{M}(H)$ path 102 will return to $\mathcal{M}=0$ at point S, 104 after completion of the decay of the applied AC waveform. During the first quarter cycle of the oscillation, $\mathcal{M}(H)$ goes to point P, 106 on the hysteresis curve at the first positive peak of the field from the surrounding coil. The next half cycle of oscillation brings the field from the demagnetizing coil to its first negative maximum and $\mathcal{M}(H)$ to point R, 108 on the curve. If the demagnetizing coil drive did not decay the curve would trace repeatedly around the parallelogram with vertices at point P, 106 and R, 108 and the two corners 110 between them. The decaying drive however causes the curve to trace the dashed lines 112 in the directions indicated by the arrows 114. When the demagnetization drive has decayed to values less than $H_P$, the non-hysteritic line 116 in the middle which is centered $\mathcal{M}=0$ at point S, 104 is repeatedly traced. Thus when the drive has decayed to zero, $\mathcal{M}=0$.

After the diminishing AC demagnetizing field reaches the magnitude below which the M(y) curve is nonhysteretic, it is imperative that the field oscillate many times as it decays to zero. Otherwise, the desired large number of alternating layers of shielding current, which produce very low net magnetization, are not produced in the film. This can be done by generating a demagnetizing field that decays as a simple exponential, $DH(t)=Dho \exp[-t/t]$, where $t \gg T$, $T$ bearing the period of the AC magnetization.

Figure 12:
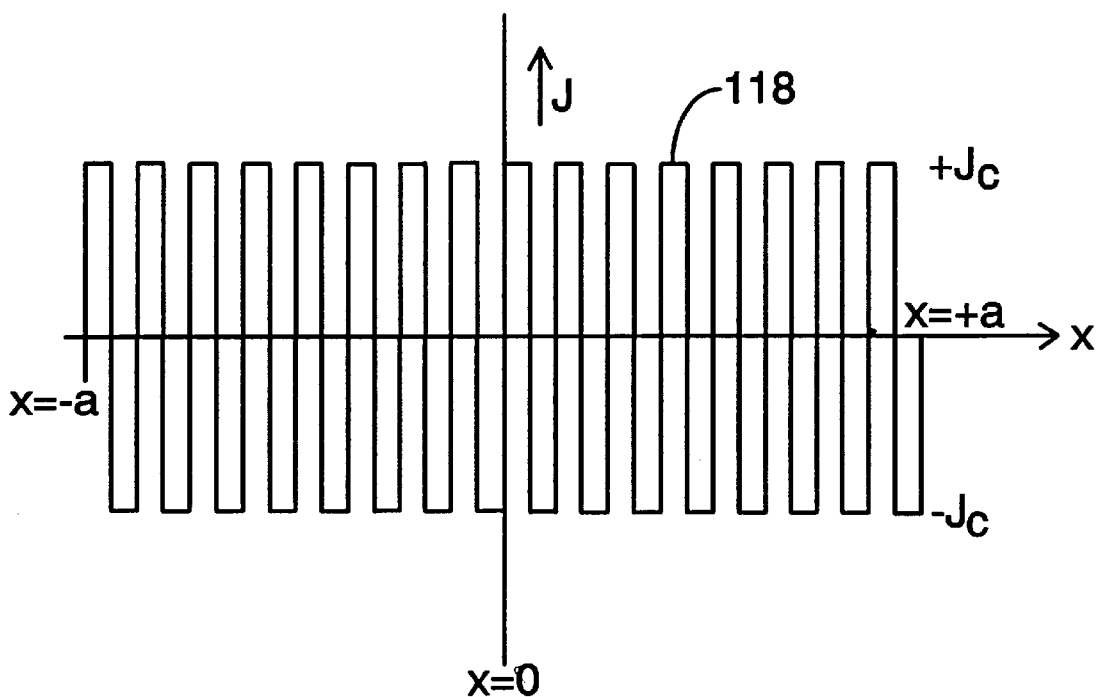
FIG. 12 shows a plot of current density in a superconducting film after an AC demagnetization procedure.
Figure 13:
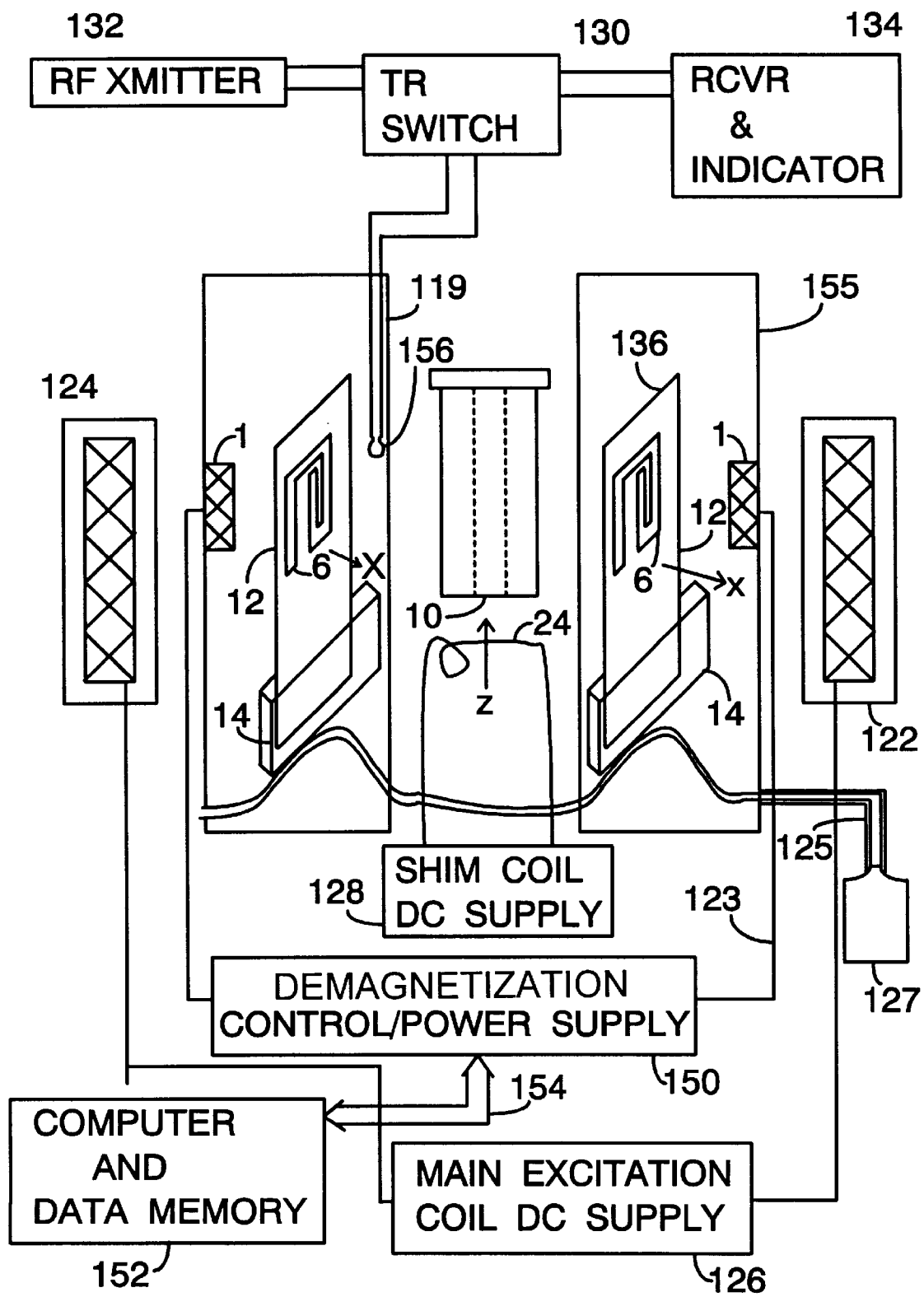
FIG. 13 shows a system emplying the present invention.

With reference to FIG. 12, the current density distribution 118 as a function of position in the film is shown which corresponds to a linear decaying demagnetization drive. Instead of the current quadrupole as shown in FIG. 10 that results from the single pulse technique, the AC drive technique produces a current multipole of higher order resulting in even lower stray magnetic fields.

FIG. 13 shows an NMR system including a demagnetization coil 1 shown interposed between a HTS thin film coil pair 6 and the main field winding coil 124. The demagnetization coil 1 is connected electrically to the control/power supply 150 which is coupled to a computer 153 via a bus 154. The computer includes memory. The structure of the remainder of the NMR system is standard. Sample holder 10 is shown schematically axially positioned within a space where very high magnetic fields are provided by main field coils 124 under DC supply control 126. The HTS coil pair 6 is mounted to a substrate 12 which is held in a heat transfer base for cooling via gas flow from cryostat 127 through conduits 125 and 129. The HTS probe coils are shown in the vacuum vessel 155 to reduce heat transfer. The demagnetization coil is also shown inside the vacuum vessel but since this is a normal coil it does not need to be inside the vessel and would be mounted to the outside of the vessel. The probe coil pair is coupled to the RF transmitter 132 and receiver 134 via transmit/receive switch 130 and loop antenna 156. Coil 1 can also be a plurality of coils.

In the above description of the invention the applied field H has been assumed to be parallel to the face of the superconductive film, and the critical currents $J_C$ to flow in one direction along the +y-axis on one side of the superconductive film and in the opposite direction along the −y-axis on the other side of the film. In many cases the surface of the film may not be perfectly aligned with field or may be normal or nearly normal to the direction of the applied field. In this case critical current attempts to flow in planes normal to the applied field components, constrained of course to the boundaries of the subconductive film. Since the width of the superconductive coil structure(71' in FIG. 7b) can be and normally is large compared to the thickness of the superconducting film (71 in FIG. 7b), the effect of these other currents is to form larger loops and corresponding greater degree of magnetic fields distortion over the sample volume. In this case the demagnetization can be carried out by also applying a demagnetizing field normal to the surface of the superconductive film. The same techniques of single pulsing, multiple pulsing with pulses of opposite field direction, or applying a slowly decaying AC field may be used.

In the case of a complex superconducting probe coil geometry it may be desirable to have an array of demagnetizing coils. Each coil could control the maximum field excursion seen by a different part of the superconducting rf probe coil structure. This arrangement might provide better overall control of the compensation. By way of example one demagnetizing coil could provide an approximately uniform field over the entire probe coil structure while another could be in the form of a linear gradient demagnetizing coil that could provide greater demagnetizing fields at the ends of the structure.

The demagnetization process must be carried out each time a probe containing a rf probe coil is inserted into the magnet. Each different rf probe coil may require a different recipe for demagnetization, which could be preserved in a data bank. Each time a probe is inserted into the magnet the demagnetizing coil power supply could be programmed to read the identifying data for the particular probe and automatically provide the correct demagnetizing process.

An essential feature of the inventive process described herein is utilization of the hysteritic behavior of the type II superconductor material. Because of this hysteritic behavior, the thermodynamic magnetization $\mathcal{M}$ of superconducting components used in NMR probes may be reduced to zero or near zero when, after insertion into the polarizing field of the spectrometer, they are temporarily exposed to additional appropriate demagnetizing fields. Although demagnetizing fields described herein are attributed to currents passed through demagnetizing coils, said coils surrounding the superconducting components, it is not intended that this invention be restricted to demagnetizing fields produced in that manner. Rather, it is intended that the invention be interpreted broadly as being applicable to demagnetizing fields produced in any manner whatsoever. By way of example of an alternative to demagnetizing coils, a suitable incremental demagnetizing field parallel to the surface of a thin film superconducting coil may be briefly provided by a transient decaying oscillatory movement of the superconducting coil relative to the main static polarizing field. An embodiment utilizing this alternative is the subject of my copending patent application, Ser. No. 08/965,730, Filing Date Nov. 07, 1997, entitled "Nuclear Magnetic Resonance Methods and Apparatus", which is filed concurrently herewith. Although the demagnetizing process described herein is applied to superconducting NMR receiver coils, it is not intended that the inventive process be so restricted. Rather it is intended that the process be applicable to any superconducting component part used in NMR probes when homogeneity is essential such as Faraday shields by way of example. In accordance with these considerations, the scope of the invention should be construed in view of my claims. With this in mind,

What is claimed is:

1. A nuclear magnetic resonance system comprising:
   a magnet to produce a static polarizing magnetic field; a probe, said probe installed in said polarizing magnetic field, said probe having a sample region therein, said probe further including one or more rf probe coils proximate to said sample region to provide magnetic coupling to sample material inserted into said sample region, at least one of said rf probe coils being composed of type II superconducting material;
   means for cooling said superconducting probe coils;
   an rf transmitter for supplying rf energy to at least one of said rf probe coils;
   an rf receiver coupled to said superconducting probe coils, said receiver for amplifying and detecting any signal from said sample material;
   apparatus for providing a transient decaying AC change in the magnitude of the magnetic field in the region of the superconducting probe coils, thereby causing a change in the amount of magnetic flux trapped within said superconducting probe coils and causing demagnetization of said probe coils.

2. The system of claim 1, wherein said apparatus for providing the transient decaying AC change in the magnitude of said magnetic field comprises,
   a demagnetizing coil, said demagnetizing coils for producing magnetic field changes which change the fields pervading said superconducting coils;
   a power supplies for supplying an AC current to said demagnetizing coil; and
   a current controller to control the AC current to said demagnetizing from said power supplies.

3. The NMR system of claim 2, further comprising a computer and a data bank,
   said data bank comprising data specifically applicable to said probe;
   each said probe having a recipe for demagnetizing said superconducting coils in said probe;
   said recipe provide the correct AC current as a function of time to be supplied from said power supply to said demagnetizing coils for each said probe such that the magnetization of each said superconducting probe coil is reduced to zero or near zero.

4. The NMR system of claim 3, wherein the peak amplitude of said AC current supplied to said demagnetizing coils initially causes an incremental increase in the magnitude of said magnetic field greater than the product of 1) the critical current density JC of said superconducting coils and 2) the thickness of said superconducting coils, and wherein the magnitude of said AC current is thereafter slowly reduced from its initial value to zero, causing the effective magnetization of said superconducting coils to traverse a decaying hysteritic path in the magnetization verses applied-field space, said hysteritic path encompassing the point $H=H_0$, and $\mathcal{M}=0$ and ultimately settling to the $\mathcal{M}=0$ point when the AC current applied to said demagnetizing coils has returned to zero.

5. The NMR system of claim 4, wherein said superconducting probe coil material is $YBa_2Cu_3O_{7-\delta}$(YBCO).

6. The NMR system of claim 2, wherein the peak amplitude of said AC current supplied to said demagnetizing coils initially causes an incremental increase in the magnitude of said magnetic field greater than the product of 1) the critical current density $J_C$ of said superconducting coils and 2) the thickness of said superconducting coils, and wherein the magnitude of said AC current is thereafter slowly reduced from its initial value to zero, causing the effective magnetization of said superconducting coils to traverse a decaying hysteritic path in the magnetization verses applied-field space, said hysteritic path encompassing the point $H=H_0$, and $\mathcal{M}=0$ and ultimately settling to that point when the AC current applied to said demagnetizing coils has returned to zero.

7. The NMR system of claim 6, wherein said superconducting probe coil material is $YBa_2Cu_3O_{7-\delta}$(YBCO).

8. An AC process for demagnetizing superconducting rf probe coils used in No systems comprising the steps of:
   providing an NMR system comprising a magnet to produce a static polarizing magnetic field, a probe in said magnetic field, said probe having a sample region therein, said probe containing one or more rf probe coils proximate to said sample region to provide magnetic coupling to any sample material in said sample region, at least one of said rf probe coils being composed of superconducting material, means for cooling said superconducting probe coils, an rf transmitter for supplying rf energy to at least one of said rf probe coils and an rf receiver coupled to said superconducting probe coils, said receiver function for amplifying and detecting any signal from said sample material and apparatus for changing the magnitude of said magnetic field in the region of said superconducting probe coils, said apparatus being comprised of (i) one or more demagnetizing coils, (ii) one or more power supplies for supplying AC current to said demagnetizing coils and (iii) a controller to control the AC current from said power supplies to said superconductive probe coils;
   demagnetizing said superconducting rf probe coils including the steps of (i) positioning said sample region in said static polarizing field, (ii) changing the magnitude of the magnetic field at said superconducting coil pairs, said change causing expulsion of magnetic flux from the coils comprising said superconducting coil pairs, said change being of a magnitude and sense such that upon its removal the magnetization of said coils comprising said superconducting coil pairs may be reduced to zero or near zero, (iii) removing said change in magnitude of said magnetic field causing said magnetization of said coils to move towards zero along a hysteritic path in the magnetization verses applied-field space;
   automating said demagnetization process by utilizing a computer and a data bank, said data bank comprising data specifically applicable to available probes, each said probe having computer readable identification marking thereupon such that on insertion into said NMR system said computer identifies each said probe and chooses, from said data bank, appropriate data comprised of a recipe for demagnetizing said superconducting coils in each said probe; and
   supplying the correct AC current from said power supply to said demagnetizing coils for each said available probe according to such recipe such that the magnetization of each said superconducting probe coil is reduced to zero or near zero.

9. The process of claim 8, wherein the peak amplitude of said AC current supplied to said demagnetizing coils initially causes an incremental increase in the magnitude of said magnetic field greater than the product of the critical current density $J_C$ of said superconducting coils and the thickness of said superconducting coils, and wherein the magnitude of said AC current is thereafter slowly reduced from its initial value to zero, causing the effective magnetization of said t5 superconducting coils to traverse a decaying hysteritic path in the magnetization verses applied-field space, said hysteritic path encompassing the point $H=H_0$, and $\mathcal{M}=0$ and ultimately settling to that point when the AC current applied to said demagnetizing coils has returned to zero.

10. The process of claim 9, wherein said superconducting probe coil material is $YBa_2Cu_3O_{7-\delta}$(YBCO).

* * * * *